(12) United States Patent
Uno et al.

(10) Patent No.: US 11,133,788 B2
(45) Date of Patent: Sep. 28, 2021

(54) BONDED BODY AND ELASTIC WAVE ELEMENT

(71) Applicant: NGK INSULATORS, LTD., Nagoya (JP)

(72) Inventors: Yudai Uno, Nagoya (JP); Masashi Goto, Nagoya (JP); Tomoyoshi Tai, Inazawa (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/128,724

(22) Filed: Dec. 21, 2020

(65) Prior Publication Data

US 2021/0111698 A1 Apr. 15, 2021

Related U.S. Application Data

(63) Continuation of application No. PCT/JP2019/016504, filed on Apr. 17, 2019.

(30) Foreign Application Priority Data

Jun. 22, 2018 (JP) .............................. JP2018-118580

(51) Int. Cl.
*H03H 3/08* (2006.01)
*H03H 9/02* (2006.01)
(Continued)

(52) U.S. Cl.
CPC ....... *H03H 9/02574* (2013.01); *H01L 41/312* (2013.01); *H03H 3/08* (2013.01); *H03H 9/02559* (2013.01); *H03H 9/25* (2013.01)

(58) Field of Classification Search
CPC .. H03H 9/02574; H03H 9/02559; H03H 9/25; H03H 3/08; H01L 41/312
See application file for complete search history.

(56) References Cited

U.S. PATENT DOCUMENTS 7,213,314 B2 5/2007 Abbott et al.
2004/0226162 A1 11/2004 Miura et al.
(Continued)

FOREIGN PATENT DOCUMENTS

CN 105981132 A 9/2016
JP 3774782 B2 12/2004
(Continued)

OTHER PUBLICATIONS

International Search Report with English Translation issued in corresponding International Application No. PCT/JP2019/016504 dated Jun. 25, 2019 (5 pages).
(Continued)

*Primary Examiner* — Bryan P Gordon
(74) *Attorney, Agent, or Firm* — Flynn Thiel, P.C.

(57) ABSTRACT

A bonded body includes: a piezoelectric single crystal substrate; a supporting substrate composed of a single crystal silicon; a bonding layer—provided between the supporting substrate and piezoelectric single crystal substrate and having a composition of $Si_{(1-x)}O_x$ ($0.008 \leq x \leq 0.408$); and an amorphous layer provided between the supporting substrate and bonding layer and containing silicon atoms, oxygen atoms, and argon atoms. The concentration of the oxygen atoms in an end part of the amorphous layer on a side of the bonding layer is higher than the average concentration of the oxygen atoms in the bonding layer.

4 Claims, 4 Drawing Sheets

(51) Int. Cl.
*H01L 41/312* (2013.01)
*H03H 9/25* (2006.01)

(56) References Cited

U.S. PATENT DOCUMENTS

| | | |
|---|---|---|
| 2010/0182101 A1 | 7/2010 | Suzuki |
| 2013/0119504 A1* | 5/2013 | Ishitsuka ............... G01F 1/6845 |
| | | 257/467 |
| 2014/0009036 A1* | 1/2014 | Iwamoto ................. H01L 41/27 |
| | | 310/348 |
| 2015/0085023 A1* | 3/2015 | Sakai ..................... B41J 2/1623 |
| | | 347/70 |
| 2016/0358828 A1 | 12/2016 | Ide et al. |
| 2017/0077897 A1* | 3/2017 | Otsubo ............. H03H 9/02881 |
| 2017/0222622 A1* | 8/2017 | Solal ...................... H03H 9/562 |
| 2019/0007022 A1 | 1/2019 | Goto et al. |
| 2019/0036009 A1* | 1/2019 | Tai ..................... H03H 9/02826 |
| 2019/0036505 A1* | 1/2019 | Akiyama ............ H01L 41/1873 |
| 2019/0326878 A1* | 10/2019 | Kakita .................. H01L 41/047 |
| 2020/0058842 A1 | 2/2020 | Akiyama et al. |

FOREIGN PATENT DOCUMENTS

| | | |
|---|---|---|
| JP | 2004343359 A | 12/2004 |
| JP | 2010187373 A | 8/2010 |
| JP | 3184763 U | 7/2013 |
| JP | 201486400 A | 5/2014 |
| WO | 2012124648 A1 | 9/2012 |
| WO | 2017134980 A1 | 8/2017 |
| WO | 2018088093 A1 | 5/2018 |
| WO | 2018180827 A1 | 10/2018 |

OTHER PUBLICATIONS

Written Opinion of International Searching Authority issued in corresponding International Application No. PCT/JP2019/016504 dated Jun. 25, 2019, 2019 (4 pages).
English Translation of the International Preliminary Report on Patentability, issued in corresponding International Application No. PCT/JP2019/016504 dated Dec. 30, 2020 (7 pages).
Chinese Office Action issued in corresponding Chinese Application No. 201980034943.7 dated Mar. 10, 2021 (7 pages).

* cited by examiner

BONDED BODY AND ELASTIC WAVE ELEMENT

CROSS-REFERENCE TO RELATED APPLICATIONS

This is a continuation of PCT/JP2019/016504, filed Apr. 17, 2019, which claims priority to Japanese Application No. 2018-118580, filed Jun. 22, 2018, the entire contents of which are hereby incorporated by reference.

TECHNICAL FIELD

The present invention relates to a bonded body and an acoustic wave device.

BACKGROUND ARTS

A surface acoustic wave device functioning as a filter device or oscillator used in mobile phones or the like, and an acoustic wave device such as lamb wave device or film bulk acoustic resonator (FBAR) using a piezoelectric thin film, are known. A device produced by adhering a supporting body and a piezoelectric substrate propagating a surface acoustic wave and by providing interdigitated electrodes capable of oscillating the surface acoustic wave on a surface of the piezoelectric substrate is known as an acoustic wave device. By adhering the supporting body, whose thermal expansion coefficient is lower than that of the piezoelectric substrate, onto the piezoelectric substrate, the change of the size of the piezoelectric substrate responsive to temperature change is reduced so that the change of the frequency characteristics as the surface acoustic wave device is reduced.

Patent Document 1 proposes a surface acoustic wave device having the structure produced by adhering a piezoelectric single crystal substrate and silicon substrate with an adhesive layer composed of an epoxy adhering agent.

Here, it is known that, when bonding a piezoelectric substrate and silicon substrate, a silicon oxide film is formed on a surface of the piezoelectric substrate and the silicon substrate and the piezoelectric substrate are directly bonded through the silicon oxide film. A plasma beam is irradiated onto the surfaces of the silicon oxide film and silicon substrate to activate the surfaces, followed by the direct bonding (Patent Document 2).

Further, a direct bonding method of a so-called FAB (Fast Atom Beam) system is known. According to this method, a neutralized atomic beam is irradiated onto the respective bonding surfaces at ambient temperature and the direct bonding is performed (Patent Document 3).

A piezoelectric single crystal substrate directly bonded to a supporting substrate composed of a ceramic material (alumina, aluminum nitride, silicon nitride) through an intermediate layer, not to a silicon substrate is described (Patent Document 4). The material of the intermediate layer is made silicon, silicon oxide, silicon nitride, or aluminum nitride.

Further, when a piezoelectric substrate and a supporting substrate are bonded with an organic adhesive, Rt (maximum height of the profile of a roughness curve) of an adhesive surface of the supporting substrate to the piezoelectric substrate is made 5 nm or larger and 50 nm or smaller to obtain the effect of preventing the fracture by the stress relaxation (Patent Document 5).

RELATED ARTS

Patent Documents

Patent Document 1: Japanese Patent Publication No. 2010-187373A
Patent Document 2: U.S. Pat. No. 7,213,314 B2
Patent Document 3: Japanese Patent Publication No. 2014-086400A
Patent Document 4: Japanese Patent Publication No. 3774782B
Patent Document 5: Japanese Utility model Registration No. 3184763U

SUMMARY OF THE INVENTION

However, depending on the application of the bonded body, improving the insulating property by raising the electric resistance of the bonding layer is desired. For example, in the case of an acoustic wave device, noise or loss can be reduced by improving the insulating property of the bonding layer. However, it is difficult to bond the supporting substrate to the piezoelectric single crystal substrate through the bonding layer of a high resistance at a high strength, so that the peeling tends to occur between the piezoelectric single crystal substrate and the supporting substrate during the subsequent processing step.

An object of the present invention is, in a bonded body including a supporting substrate composed of a single crystal silicon and a piezoelectric single crystal substrate, to provide the structure capable of improving the bonding strength of the supporting substrate and piezoelectric single crystal substrate while applying a high-resistance bonding layer.

The present invention provides a bonded body comprising:
a piezoelectric single crystal substrate;
a supporting substrate comprising a single crystal silicon;
a bonding layer provided between the supporting substrate and the piezoelectric single crystal substrate and having a composition of $Si_{(1-x)}O_x$ ($0.008 \leq x \leq 0.408$); and
an amorphous layer provided between the supporting substrate and the bonding layer, said amorphous layer comprising silicon atoms, oxygen atoms, and argon atoms,
wherein a concentration of the oxygen atoms at an end part of the amorphous layer on a side of the supporting layer is higher than an average concentration of the oxygen atoms in the bonding layer.

The present invention further provides an acoustic wave device comprising:
the bonded body; and
an electrode provided on the piezoelectric single crystal substrate.

According to the present invention, the insulation property of the bonding layer can be made high, and the bonding strength can be assured, by providing the bonding layer having the specific composition described above.

Moreover, when such bonding layer is provided, a thin amorphous layer is generated along an interface between the bonding layer on the piezoelectric single crystal substrate and the supporting substrate. However, as the piezoelectric single crystal substrate of the thus obtained bonded body is thinned by polishing or the like, separation from the supporting substrate may occur. This means that the bonding strength of the piezoelectric single crystal substrate to the supporting substrate is not sufficiently high.

Thus, the inventors researched the cause of the reduction of the bonding strength. When a high-resistance bonding layer composed of $Si_{(1-x)}O_x$ is bonded to a supporting substrate composed of a single crystal silicon, an amorphous layer containing silicon atoms, oxygen atoms, and argon atoms along the interface of both is generated. In this case, as the concentration of the contained oxygen atoms is extremely low in the supporting substrate composed of the single crystal silicon, a gradient of oxygen concentration should be generated from the bonding layer toward the supporting substrate.

The inventors focused on this point and actually measured the gradient of the oxygen concentration from the bonding layer to the supporting substrate. It is thus proved that the oxygen concentration gradually or continuously decreased from the bonding layer toward the supporting substrate. In other words, there is no peak of the oxygen concentration in the amorphous layer. As the phenomenon is studied, there is the possibility that the diffusion of oxygen from the bonding layer to the supporting layer may be insufficient.

From this viewpoint, the inventors researched various methods for facilitating the diffusion of oxygen atoms from the bonding layer to the supporting substrate. It is thus found that the bonding strength of the piezoelectric single crystal substrate to the supporting substrate is improved, and the separation of the piezoelectric single crystal substrate is suppressed, when the peak of the oxygen concentration is generated within the amorphous layer. The present invention is thus made.

EMBODIMENTS FOR CARRYING OUT THE INVENTION

The present invention will be described further in detail below, appropriately referring to drawings.

Figure 1A:
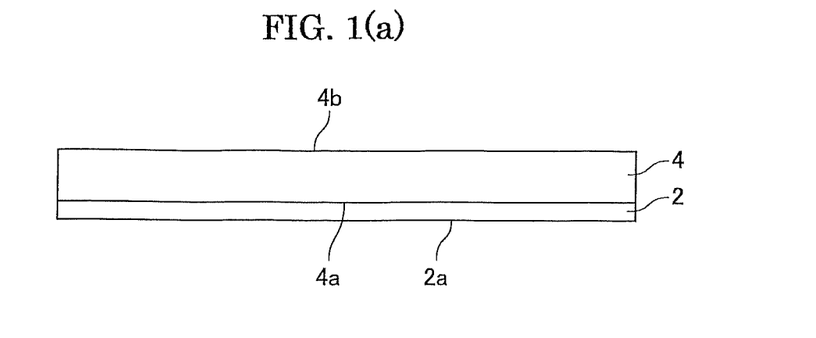
FIG. 1(a) shows the state where a bonding layer 2 is provided on a surface 4a of a piezoelectric single crystal substrate 4.

According to an embodiment shown in FIGS. 1 and 2, first, as shown in FIG. 1(a), a bonding layer 2 is provided on a surface 4a of a piezoelectric single crystal substrate 4. 4b represents a surface on the opposite side. At this time, an irregularity may be present on a surface 2a of the bonding layer 2.

Figure 1B:
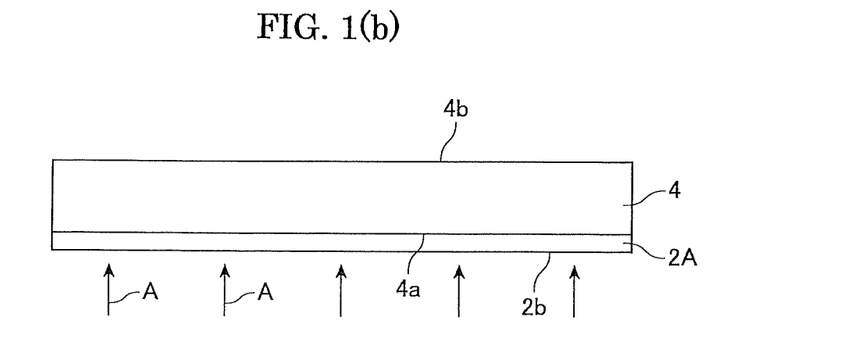
FIG. 1(b) shows the state where a surface 2b of a bonding layer 2A is activated by neutralized beam A.

According to a preferred embodiment, the surface 2a of the bonding layer 2 is then subjected to a flattening process to form a flat surface 2b on the bonding layer, as shown in FIG. 1(b). The thickness of the bonding layer 2 is usually made smaller by the flattening process, resulting in a thinner bonding layer 2A (see FIG. 1(b)). However, the flattening process is not necessarily performed. A neutralized beam is then irradiated onto the surface 2b of the bonding layer 2A as arrows A to activate the surface of the bonding layer 2A to provide an activated surface.

Figure 1C:
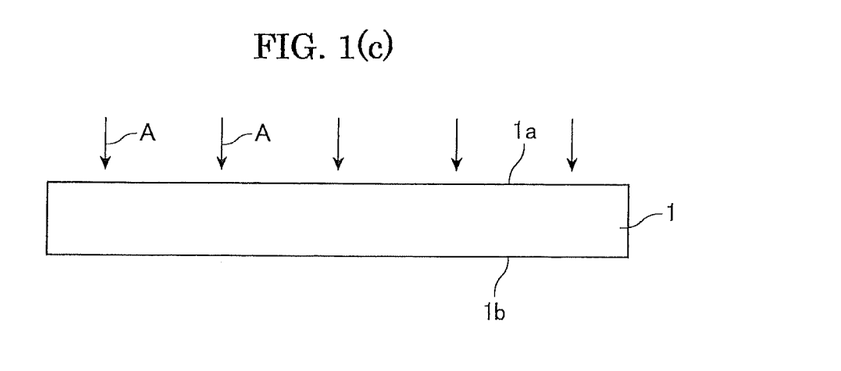
FIG. 1(c) shows the state where a surface 1a of a supporting substrate 1 is activated by neutralized beam A.
Figure 2A:
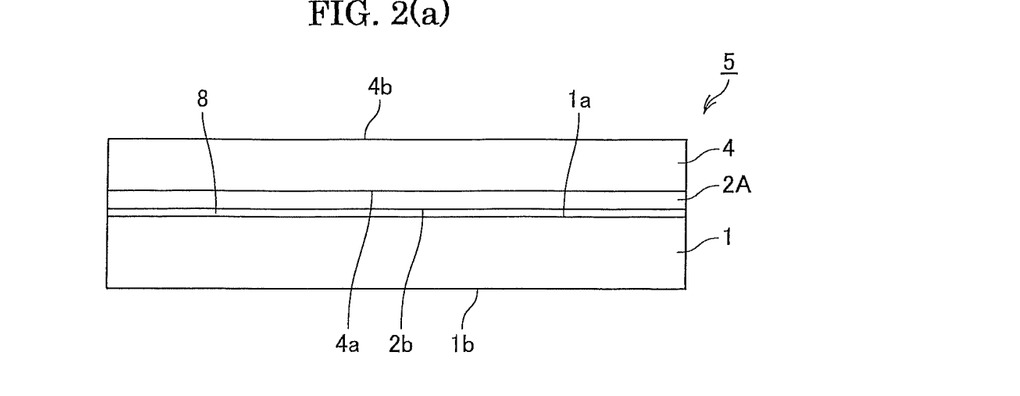
FIG. 2(a) shows the state where the piezoelectric single crystal substrate 4 and the supporting substrate 1 are bonded with each other.

Further, as shown in FIG. 1(c), a neutralized beam A is irradiated onto the surface 1a of the supporting substrate 1 to activate it to provide an activated surface 1a. 1b represents a surface on the opposite side. As shown in FIG. 2(a), the activated surface 2b of the bonding layer 2A on the piezoelectric single crystal substrate 4 and the activated surface 1a of the supporting substrate 1 are then directly bonded with each other to obtain a bonded body 5.

Figure 2B:
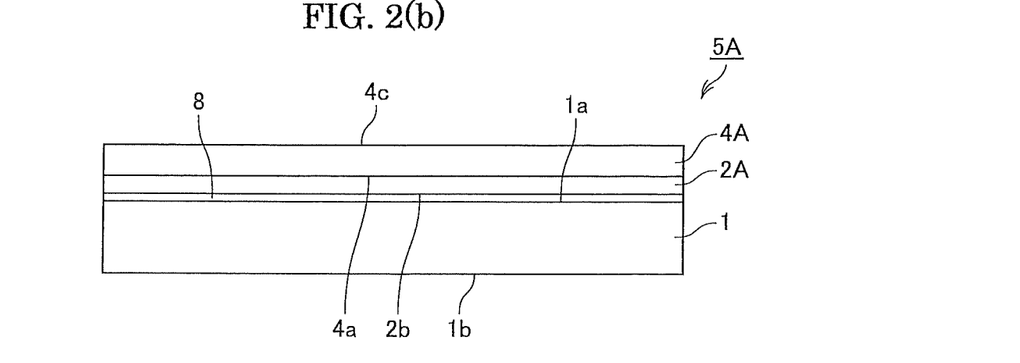
FIG. 2(b) shows the state where a piezoelectric single crystal substrate 4A is thinned by processing.

According to a preferred embodiment, the surface 4b of the piezoelectric single crystal substrate 4 of the bonded body 5 is further subjected to polishing to thin the piezoelectric single crystal substrate 4A and to obtain a bonded body 5A, as shown in FIG. 2(b). 4c represents a polished surface.

Figure 2C:
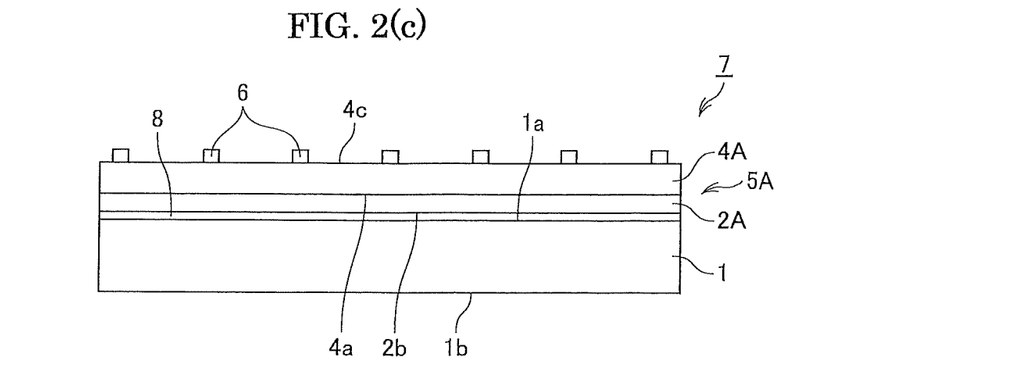
FIG. 2(c) shows the state where an electrode 6 is provided on the piezoelectric single crystal substrate 4A.

According to FIG. 2(c), predetermined electrodes 6 are formed on the polished surface 4c of the piezoelectric single crystal substrate 4A to produce an acoustic wave device 7.

Here, the amount of the energy irradiated onto each activated surface is appropriately adjusted to generate an amorphous layer 8 along an interface between the bonding layer 2A and the supporting substrate 1, as shown in FIGS. 2(a), 2(b) and 2(c).

Figure 3A:
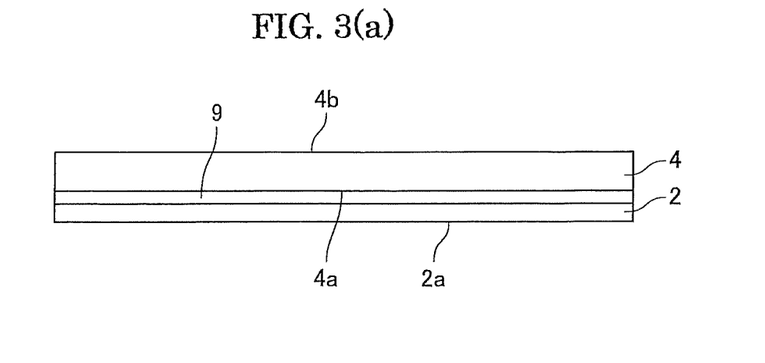
FIG. 3(a) shows the state where an intermediate layer 9 and the bonding layer 2 are provided on the surface 4a of the piezoelectric single crystal substrate 4.
Figure 3B:
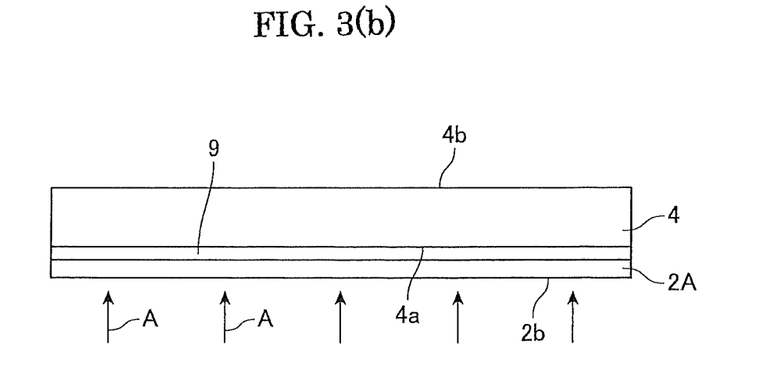
FIG. 3(b) shows the state where the surface 2b of a bonding layer 2A is activated by neutralized beam A.

According to an embodiment shown in FIGS. 3 and 4, as shown in FIG. 3(a), an intermediate layer 9 is then provided on a surface 4a of a piezoelectric single crystal substrate 4, and a bonding layer 2 is provided on the intermediate layer 9. The surface 2a of the bonding layer 2 is then subjected to a flattening process to form a flat surface 2b on the bonding layer, as shown in FIG. 3(b). The thickness of the bonding layer 2 is usually made smaller by the flattening process to provide a thinner bonding layer 2A. A neutralized beam, shown by arrows A, is irradiated onto the surface 2b of the bonding layer 2A to activate the surface of the bonding layer 2A to provide an activated surface.

Figure 3C:
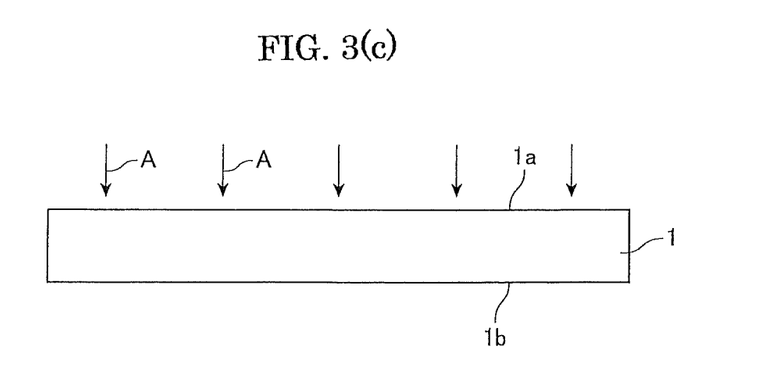
FIG. 3(c) shows the state where the surface 1a of the supporting substrate 1 is activated by neutralized beam A.

Further, as shown in FIG. 3(c), a neutralized beam A is irradiated onto the surface 1a of the supporting substrate 1 to activate it to provide an activated surface 1a. Then, as shown in FIG. 4(a), the activated surface 2b of the bonding layer 2A on the piezoelectric single crystal substrate 4 and the activated surface 1a of the supporting substrate 1 are directly bonded with each other to obtain a bonded body 15.

Figure 4A:
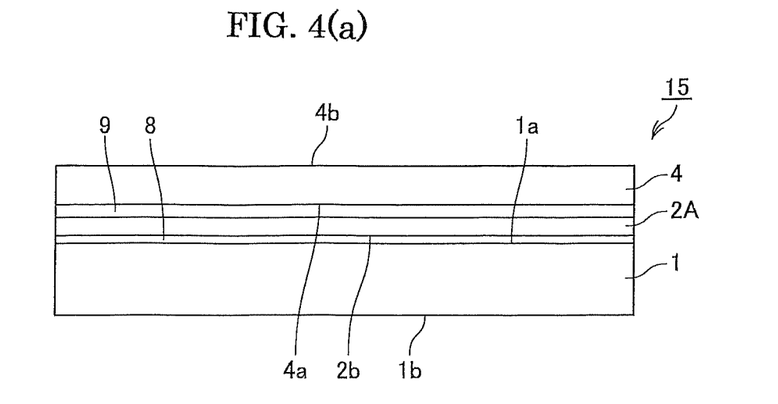
FIG. 4(a) shows the state where the piezoelectric single crystal substrate 4 and the supporting substrate 1 are bonded with each other.
Figure 4B:
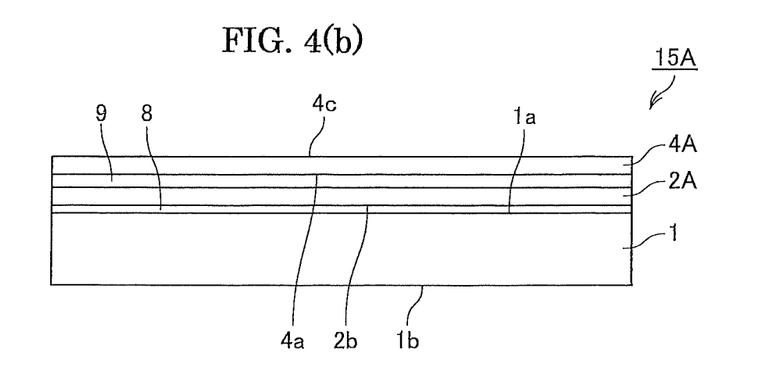
FIG. 4(b) shows the state where the piezoelectric single crystal substrate 4A is thinned by processing.
Figure 4C:
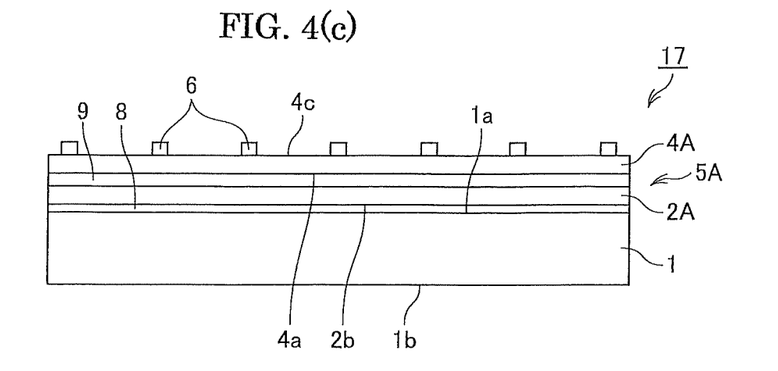
FIG. 4(c) shows the state where the electrode 6 is provided on the piezoelectric single crystal substrate 4A.

According to a preferred embodiment, the surface 4b of the piezoelectric single crystal substrate 4 of the bonded body 15 is further subjected to polishing to thin a piezoelectric single crystal substrate 4A to obtain a bonded body 15A, as shown in FIG. 4(b). As shown in FIG. 4(c), predetermined electrodes 6 are formed on a polished surface 4c of the piezoelectric single crystal substrate 4A to produce an acoustic wave device 17.

Here, the amount of the energy irradiated onto each activated surface is appropriately adjusted to generate an amorphous layer 8 along an interface between the bonding layer 2A and the supporting substrate 1, as shown in FIGS. 4(a), 4(b) and 4(c).

Respective constituents of the present invention will be described further in detail below.

(Supporting Substrate)

According to the present invention, the supporting substrate 1 is composed of a single crystal silicon. A transition metal element or a rare earth element may be doped into the single crystal silicon.

(Piezoelectric Single Crystal Substrate)

Specifically, as the materials of the piezoelectric single crystal 4 and 4A, single crystals of lithium tantalate (LT), lithium niobate (LN), lithium niobate-lithium tantalate solid solution, quartz, and lithium borate may be listed. Among them, LT or LN is more preferred. As LT or LN has a high propagation speed of a surface acoustic wave and large electro-mechanical coupling factor, it is preferred for use in a piezoelectric surface acoustic wave device for high frequency and wide-band frequency applications. Further, the normal direction of the main surface of the piezoelectric single crystal substrate 4 or 4A is not particularly limited. However, when the piezoelectric single crystal substrate 4 or 4A is made of LT, for example, it is preferred to use the substrate rotated from Y-axis to Z-axis by 36 to 47° (for example, 42°) with respect to X-axis, which is a direction of propagation of a surface acoustic wave, because of a low propagation loss. When the piezoelectric single crystal substrate 4 or 4A is made of LN, it is preferred to use the substrate rotated from Y-axis to Z-axis by 60 to 68° (for example, 64°) with respect to X-axis, which is a direction of propagation of a surface acoustic wave, because of a lower propagation loss. Further, although the size of the piezoelectric single crystal substrate 4 or 4A is not particularly limited, for example, the diameter may be 50 to 150 mm and thickness may be 0.2 to 60 μm.

(Bonding Layer)

According to the present invention, the bonding layer 2A is provided between the supporting substrate 1 and piezoelectric single crystal substrate 4 or 4A, and the bonding layer 2A has a composition of $Si_{(1-x)}O_x$ (0.008≤x≤0.408). The composition has an oxygen concentration that is considerably lower than that of $SiO_2$ (x=0.667). When the piezoelectric single crystal substrate 4 or 4A is bonded to the supporting substrate 1 through the bonding layer 2A made of the silicon oxide $Si_{(1-x)}O_x$, the bonding strength can be made high and the insulating property of the bonding layer 2A can be made high.

When x is lower than 0.008 in the composition of $Si_{(1-x)}O_x$ forming the bonding layer 2A, the electrical resistance of the bonding layer 2A is low and desired insulating property cannot be obtained. Thus, x is 0.008 or higher, preferably 0.010 or higher, more preferably 0.020 or higher, and most preferably 0.024 or higher. Further, when x exceeds 0.408, the bonding strength is lowered and the separation of the piezoelectric single crystal substrate 4 or 4A tends to occur. Thus, x is 0.408 or lower and more preferably 0.225 or lower.

The electrical resistivity of the bonding layer 2A may preferably be $4.8 \times 10^3$ Ω·cm or higher, more preferably be $5.8 \times 10^3$ Ω·cm or higher, and particularly preferably be $6.2 \times 10^3$ Ω·cm or higher. Further, the electrical resistivity of the bonding layer 2A is generally $1.0 \times 10^8$ Ω·cm or lower.

Although the thickness of the bonding layer 2A is not particularly limited, it may preferably be 0.01 to 10 μm and more preferably be 0.01 to 0.5 μm, from the viewpoint of production cost.

Although the film-forming method of the bonding layer 2 or 2A is not particularly limited, sputtering method, chemical vapor deposition (CVD) method, and vapor deposition method may be listed. Here, particularly preferably, the amount of oxygen gas flowed into a chamber is adjusted so that the oxygen ratios (x) in the bonding layer 2A can be controlled during reactive sputtering using a sputtering target of Si.

Although specific conditions are appropriately selected depending on the chamber specifications, according to a preferred example, the total pressure is made 0.28 to 0.34 Pa, the partial pressure of oxygen is made $1.2 \times 10^{-3}$ to $5.7 \times 10^{-2}$ Pa, and the film-forming temperature is set to ambient temperature. Further, Si doped with B is exemplified as the Si target. As described later, the amount of B (boron) as an impurity is controlled at about $5 \times 10^{18}$ atoms/cm$^3$ to $5 \times 10^{19}$ atoms/cm$^3$ at an interface between the bonding layer 2, 2A and the supporting substrate 1. Thereby, it is possible to obtain the insulation property of the bonding layer 2A more assuredly.

(Intermediate Layer)

An intermediate layer 9 may be further provided between the bonding layer 2 or 2A and the piezoelectric single crystal substrate 4 or 4A. Preferably, the intermediate layer 9 improves the adhesion of the bonding layer 2 or 2A and the piezoelectric single crystal substrate 4 or 4A. The intermediate layer 9 may preferably be composed of $SiO_2$, $Ta_2O_5$, $TiO_2$, $ZrO_2$, $HfO_2$, $Nb_2O_3$, $Bi_2O_3$, $Al_2O_3$, MgO, AlN, or $Si_3N_4$. Most preferably, the intermediate layer is composed of $SiO_2$.

(Amorphous Layer)

According to the present invention, an amorphous layer 8 is provided between the supporting substrate 1 and the bonding layer 2A. The amorphous layer 8 contains at least silicon atoms, oxygen atoms, and argon atoms.

According to the present invention, the oxygen concentration at the end of the amorphous layer 8 on the side of the bonding layer 2A is made higher than an average oxygen concentration of the bonding layer 2A. Further, when the concentration of oxygen atoms at the end of the amorphous layer 8 on the side of the bonding layer 2A is measured, it is to be measured at a distance of 1 nm or less from the interface of the amorphous layer 8 on the side of the bonding layer 2A. Further, the average oxygen concentration of the bonding layer 2A is defined as an average of measured values at three points in the bonding layer 2A composed of a point at a distance of nm from the interface of the bonding layer 2A on the side of the piezoelectric single crystal substrate 4A, a point at the center of the thickness of the bonding layer 2A, and a point in the bonding layer 2A at a distance of 4 nm from the interface on the side of the amorphous layer.

The oxygen concentration at the end of the amorphous layer 8 on the side of the bonding layer 2A may preferably be 1.08 atomic % or higher and more preferably be 1.1 atomic % or higher, from the viewpoint of electrical conductivity. Further, the concentration of oxygen atoms at the end of the amorphous layer 8 on the side of the bonding layer 2A may preferably be 41.8 atomic % or lower.

The average oxygen concentration of the bonding layer 2A may preferably be 0.8 atomic % or higher and more preferably be 1.0 atomic % or higher, from the viewpoint of electrical conductivity. Further, the average oxygen concentration of the bonding layer 2A may preferably be 40.8 atomic % or lower.

A difference between the oxygen atom concentration at an end of the amorphous layer 8 on the side of the bonding layer 2A and the average oxygen atom concentration of the bonding layer 2A may preferably be 1.0 atomic % or higher and more preferably be 1.5 atomic % or higher, from the viewpoint of improving the bonding strength. In other words, the oxygen atom concentration of the amorphous layer 8 on the side of the bonding layer 2A may preferably be higher than the average oxygen atom concentration of the bonding layer 2A by 1.0 atomic % or more, and more preferably be higher by 1.5 atomic % or more. By this, the bonding strength of the piezoelectric single crystal substrate 4 or 4A and the supporting substrate 1 can be further improved, as described later.

According to a preferred embodiment, the concentration of argon atoms at the end of the amorphous layer 8 on the side of the bonding layer 2A is made higher than the average concentration of argon atoms in the bonding layer 2A. Here, when the concentration of argon atoms at the end of the amorphous layer 8 on the side of the bonding layer 2A is measured, it is to be measured at a distance of 1 nm from the interface of the amorphous layer on the side of the bonding layer 2A. Further, the average argon concentration of the bonding layer 2A is defined as an average value of measured values at three points composed of a point in the bonding layer 2A at a distance of 4 nm from the interface of the bonding layer 2A on the side of the piezoelectric single crystal substrate 4A, a point at the center of the thickness of the bonding layer 2A, and a point in the bonding layer 2A at a distance of 4 nm the interface on the side of the amorphous layer 8.

The concentration of argon atoms at the end of the amorphous layer 8 on the side of the bonding layer 2A may preferably be 2.1 atomic % or higher and more preferably be 2.4 atomic % or higher, from the viewpoint of bonding strength. Further, the average concentration of argon atoms in the amorphous layer 8 may usually be 5.0 atomic % or lower and preferably be 4.7 atomic % or lower.

The average concentration of argon atoms in the bonding layer 2A may preferably be 1.0 atomic % or lower. It means that the contribution of the diffusion of argon atoms into the bonding layer 2A is relatively small on the improvement of the bonding strength.

The concentration of silicon atoms in the amorphous layer 8 may preferably be 77.6 to 93.6 atomic % and more preferably be 88.8 to 93.0 atomic %.

Further, the presence of the amorphous layer is confirmed as follows.
Measuring System:
The microstructure is observed using a transmission-type electron microscope "H-9500" supplied by Hitachi High-Tech Corporation.
Measuring Conditions:
A sample of a thinned piece is observed by FIB (Focused Ion Beam Method) at an accelerating voltage of 200 kV.

The concentrations of the respective atoms in the bonding layer 2A and the amorphous layer 8 are to be measured as follows.
Measuring System:
The elementary analysis is performed using an elementary analyzing system ("JEM-ARM200F" supplied by JEOL Ltd.).
Measurement Conditions:
A sample of a thinned piece is observed by FIB (Focused Ion Beam Method) at an accelerating voltage of 200 kV.
(Preferred Manufacturing Conditions)
The arithmetic average roughness Ra of the surface of the bonding layer 2A may preferably be 1 nm or smaller and more preferably be 0.3 nm or smaller. Further, the arithmetic average roughness Ra of the surface 1a of the supporting substrate 1 may preferably be 1 nm or smaller and more preferably be 0.3 nm or smaller. This further improves the bonding strength of the supporting substrate 1 and the bonding layer 2A.

The method of flattening the surfaces 2b of the bonding layer 2A and the surface 1a of the supporting substrate 1 includes lapping, chemical mechanical polishing (CMP), or the like.

According to a preferred embodiment, the surface 2b of the bonding layer 2A and the surface 1a of the supporting substrate 1 can be activated by a neutralized beam. Particularly, when the surface 2b of the bonding layer 2A and the surface 1a of the supporting substrate 1 are flat surfaces, direct bonding can be easily performed.

When the activation of the surfaces is performed using the neutralized beam, it is preferred to use a system described in Japanese Patent Publication No. 2014-086400A to generate the neutralized beam which is then irradiated. That is, a high-speed atomic beam source of a saddle field type is used as the beam source. Then, argon gas is introduced into the chamber and a high voltage is applied onto electrodes from a direct current electric source. As a result, the electric field of a saddle field type generated between the electrode (positive electrode) and a housing (negative electrode) causes motion of electrons, e, so that atomic and ion beams derived from the argon gas are generated. Among the beams that reach a grid, the ion beam is neutralized at the grid, and a beam of neutral atoms is emitted from the high-speed atomic beam source.

In the activation step by beam irradiation, the voltage may preferably be 0.5 to 2.0 kV, and the current may preferably be 50 to 200 mA.

The irradiation amount of the FAB during the activation by beam irradiation may preferably be 50 KJ to 200 KJ and more preferably be 70 KJ to 180 KJ.

Then, the activated surfaces are contacted and bonded with each other under a vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the time of the bonding is preferably 100 to 20000 N.

The application of each of the bonded bodies 5, 5A, 15, and 15A of the present invention is not particularly limited, and it may preferably be applied as an acoustic wave device or optical device.

As the acoustic wave devices 7 and 17, a surface acoustic wave device, Lamb wave-type device, thin film resonator (FBAR), or the like is known. For example, the surface acoustic wave device is produced by providing input side IDT (Interdigital transducer) electrodes (also referred to as comb electrodes or interdigitated electrodes) for oscillating a surface acoustic wave and IDT electrodes on the output side for receiving the surface acoustic wave on the surface of the piezoelectric single crystal substrate. By applying a high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate or 4A. After the Lamb type device is produced as the acoustic wave device, the metal film plays a role in improving the electro-mechanical coupling factor near the bottom surface of the piezoelectric substrate. In this case, the Lamb type device has the structure that interdigitated electrodes are formed on the surface 4b or 4c of the piezoelectric single crystal substrate 4 or 4A and that the metal film on the piezoelectric single crystal substrate 4 or 4A is exposed through a cavity provided in the supporting body 1. Materials of such metal films include aluminum, an aluminum alloy, copper, gold, or the like, for example. Further, when the Lamb wave type device is produced, a composite substrate having the piezoelectric single crystal substrate 4 or 4A without the metal film on the bottom surface may be used.

Further, a metal film and an insulating film may be provided on the bottom surface of the piezoelectric single crystal substrate 4 or 4A. The metal film plays a role of electrodes when the thin film resonator is produced as the acoustic wave device. In this case, the thin film resonator has the structure that electrodes are formed on the upper and bottom surfaces of the piezoelectric single crystal substrate 4 or 4A and the insulating film is made a cavity to expose the metal film on the piezoelectric single crystal substrate. Materials of such metal films include molybdenum, ruthenium, tungsten, chromium, aluminum, or the like, for example. Further, materials of the insulating films include silicon dioxide, phosphorus silicate glass, boron phosphorus silicate glass, or the like.

Further, examples of the optical device include an optical switching device, wavelength conversion device, and optical modulating device. Further, a periodic domain inversion structure may be formed in the piezoelectric single crystal substrate or 4A.

When the present invention is applied to the optical device, the size of the optical device can be reduced. Further, particularly when the periodic domain inversion structure is formed, it is possible to prevent the deterioration of the periodic domain inversion structure by heat treatment. Further, the materials of the bonding layers 2A of the present invention are highly insulating, the generation of domain inversion is prevented during the processing by the neutralized beam before the bonding, and the shape of the periodic domain inversion structure formed in the piezoelectric single crystal substrate or 4A is hardly disordered.

EXAMPLES

Comparative Example 1

The bonded body 5A of the Comparative Example 1 shown in Table 1 was produced according to the method described referring to FIGS. 1 and 2.

Specifically, a lithium tantalate substrate (LT substrate) having an OF (orientation flat) part, a diameter of 4 inches, and a thickness of 250 μm as the piezoelectric single crystal substrate 4, was used. A 46° Y-cut X-propagation LT substrate in which the propagation direction of surface acoustic wave (SAW) is X, and the cutting angle was a rotated Y-cut plate, was used as the LT substrate. The surface 4a of the piezoelectric single crystal substrate 4 was subjected to mirror surface polishing so that the arithmetic average roughness Ra reached 0.3 nm. Further, Ra is measured by an atomic force microscope (AFM) in a visual field of 10 μm×10 μm.

Then, the bonding layer 2 was film-formed on the surface 4a of the piezoelectric single crystal substrate 4 by a direct current sputtering method. A boron-doped Si was used as a target. Further, oxygen gas was introduced as an oxygen source. At this time, the amount of the introduced oxygen gas was changed to change the total pressure of atmosphere and partial pressure of oxygen in a chamber, so that the oxygen ratio (x) in the bonding layer 2 was adjusted. The thickness of the bonding layer 2 was made 100 to 200 nm. The arithmetic average roughness Ra of the surface 2a of the bonding layer 2 was 0.2 to 0.6 nm. Then, the bonding layer 2 was subjected to chemical mechanical polishing (CMP) so that the film thickness was made 80 to 190 μm and Ra was made 0.08 to 0.4 nm.

Further, as the supporting substrate 1, a supporting substrate 1 composed of Si and having the orientation flat (OF) part, a diameter of 4 inches, and a thickness of 500 μm, was prepared. The surfaces 1a and 1b of the supporting substrate 1 were finished by chemical mechanical polishing (CMP) so that the respective arithmetic average roughness Ra reached 0.2 nm.

Then, the flat surface 2b of the bonding layer 2A and surface 1a of the supporting substrate 1 were cleaned to remove the contamination, followed by introduction into a vacuum chamber. After it was evacuated to the order of $10^{-6}$ Pa, a high-speed atomic beam of 45 kJ was irradiated onto the bonding surfaces 1a and 2b of the respective substrates. Then, after the beam-irradiated surface (activated surface) 2b of the bonding layer 2A and the activated surface 1a of the supporting substrate 1 were brought into contact with each other, the substrates 1 and 4 were bonded by pressing at 10000 N for 2 minutes (refer to FIG. 2(a)).

Then, the surface 4b of the piezoelectric single crystal substrate 4 was then subjected to grinding and polishing so that the thickness was changed from the initial 250 μm to 1 μm (refer to FIG. 2(b)).

The elementary analysis of the thus obtained bonded body 5A was performed using an EDS (energy dispersed type X-ray spectroscopy) to measure the ratios of oxygen atoms, silicon atoms, and argon atoms.

Measuring System:
an elementary analysis system ("JEM-ARM200F" supplied by JEOL Ltd.).

Measurement Conditions:
A sample of a thinned piece is observed by a FIB (Focused Ion Beam Method) at an accelerating voltage of 200 kV.

(Bonding Strength)
The bonding strengths of the thus obtained bonded bodies 5A were measured by a crack opening method. The results were shown in Table 1.

TABLE 1

|  | Comparative example 1 | Comparative example 2 |
| --- | --- | --- |
| Piezoelectric material substrate | Lithium tantalate | Lithium tantalate |
| Supporting substrate | Si | Si |
| Irradiation amount of FAB (kJ) | 45 | 22.5 |
| Bonding strength (J/m2) | 0.8 | 0.2 |

TABLE 1-continued

| Measurement positions | | Bonding Layer 2A | End part of amorphous layer 8 on side of bonding layer 2A | Supporting substrate 1 | Bonding Layer 2A | End part of amorphous layer 8 on side of bonding layer 2A | Supporting substrate 1 |
|---|---|---|---|---|---|---|---|
| Concentration of atoms (atom %) | Si | 93.6 | 92.0 | 98.8 | 93.5 | 96.8 | 98.8 |
| | O | 6.4 | 6.0 | 1.2 | 6.5 | 2.0 | 1.2 |
| | Ar | 0 | 2.0 | 0 | 0 | 1.2 | 0 |

As shown in Table 1, according to the Comparative Example 1, the oxygen concentration in the bonding layer was 6.4 atomic %, the oxygen concentration of the amorphous layer 8 at the side of the bonding layer 2A was 6.0 atomic %, and the bonding strength was proved to be 0.8 J/m².

Comparative Example 2

The bonded body 5A was produced according to the Comparative Example 1. However, unlike the Comparative Example 1, the irradiation amount of argon atomic beam during FAB was lowered to 22.5 kJ. The results were shown in Table 1.

As a result, the oxygen concentration in the bonding layer 2A was 6.5 atomic %, the oxygen concentration at the end of the amorphous layer 8 on the side of the bonding layer 2A was 2.0 atomic %, and the bonding strength was proved to be 0.2 J/m².

Inventive Example 1

The bonded body 5A was produced according to the same procedure as that of the Comparative Example 1. However, according to the present example, the irradiation amount of argon atomic beam during FAB was made 135 kJ. The results were shown in Table 2.

was higher than the average oxygen atom concentration in the bonding layer 2A by 2.7 atomic % or more. As a result, the bonding strength was improved to 2.4 J/m².

Inventive Example 2

The bonded body 5A was produced according to the same procedure as that of the Inventive Example 1. However, according to the present example, the irradiation amount of argon atomic beam during FAB was made 90 kJ. The results were shown in Table 2.

As shown in Table 2, according to the Inventive Example 2, the oxygen atom concentration in the bonding layer 2A was 6.4 atomic %, the oxygen atom concentration at the end of the amorphous layer on the side of the bonding layer 2A was 8.5 atomic %, and the peak of the oxygen atom concentration was within the amorphous layer 8. Thus, the oxygen atom concentration at the end of the amorphous layer 8 on the side of the bonding layer 2A was higher than the average oxygen atom concentration in the bonding layer 2A by 2.1 atomic % or more. As a result, the bonding strength was improved to 2.0 J/m².

Inventive Example 3

The bonded body 5A was produced according to the same procedure as that of the Inventive Example 1. However,

TABLE 2

| | | Inventive example 1 | | | Inventive example 2 | | | Inventive example 3 | | |
|---|---|---|---|---|---|---|---|---|---|---|
| Piezoelectric material substrate | | Lithium tantalate | | | Lithium tantalate | | | Lithium tantalate | | |
| Supporting substrate | | Si | | | Si | | | Si | | |
| Irradiation amount of FAB (kJ) | | 135 | | | 90 | | | 75 | | |
| Bonding strength (J/m2) | | 2.4 | | | 2.0 | | | 1.6 | | |
| Measurement positions | | Bonding Layer 2A | End part of amorphous layer 8 on side of bonding layer 2A | Supporting substrate 1 | Bonding Layer 2A | End part of amorphous layer 8 on side of bonding layer 2A | Supporting substrate 1 | Bonding Layer 2A | End part of amorphous layer 8 on side of bonding layer 2A | Supporting substrate 1 |
| Concentration of atoms (atom %) | Si | 93.7 | 87.5 | 98.8 | 93.6 | 88.3 | 98.7 | 93.9 | 89.7 | 98.7 |
| | O | 6.3 | 9.0 | 1.2 | 6.4 | 8.5 | 1.3 | 6.1 | 7.4 | 1.3 |
| | Ar | 0 | 3.5 | 0 | 0 | 3.2 | 0 | 0 | 2.9 | 0 |

As shown in Table 2, according to the Inventive Example 1, the oxygen atom concentration at the end of the bonding layer 2A was 6.3 atomic %, the oxygen atom concentration at the end of the amorphous layer 8 on the side of the bonding layer 2A was 9.0 atomic %, and the peak of the oxygen atom concentration was present in the amorphous layer 8. Thus, the oxygen atom concentration at the end of the amorphous layer 8 on the side of the bonding layer 2A according to the present example, the irradiation amount of argon atomic beam during FAB was made 75 kJ. The results were shown in Table 2.

As shown in Table 2, according to the Inventive Example 3, the oxygen atom concentration in the bonding layer 2A was 6.1 atomic %, the oxygen atom concentration at the end of the amorphous layer on the side of the bonding layer 2A was 7.4 atomic %, and the peak of the oxygen atom concentration was present within, the amorphous layer 8. Thus, the oxygen atom concentration at the end of the amorphous layer 8 on the side of the bonding layer 2A is higher than the average oxygen atom concentration in the bonding layer 2A by 1.3 atomic % or more. As a result, the bonding strength was improved to 1.6 J/m².

As such, the oxygen atom concentration at the end of the amorphous layer 8 on the side of the bonding layer 2A is larger than the average oxygen concentration in the bonding layer 2A, so that the bonded body 5A or 15A has high insulation property and the separation of the piezoelectric single crystal substrate 4 or 4A and the supporting substrate 1 is suppressed. In particular, the oxygen atom concentration at the end of the amorphous layer on the side of the bonding layer 2A is made higher than the average oxygen atom concentration of the bonding layer 2A by 1.5 atomic % or more, so that the bonding strength of the piezoelectric single crystal substrate 4 or 4A and the supporting substrate 1 can be further improved.

The invention claimed is:

1. A bonded body comprising:
 a piezoelectric single crystal substrate;
 a supporting substrate comprising a single crystal silicon;
 a bonding layer provided between said supporting substrate and said piezoelectric single crystal substrate and having a composition of $Si_{(1-x)}O_x$, $0.008 \leq x \leq 0.408$; and
 an amorphous layer provided between said supporting substrate and said bonding layer, said amorphous layer comprising silicon atoms, oxygen atoms, and argon atoms,
 wherein a concentration of said oxygen atoms at an end part of said amorphous layer on a side of said supporting layer is higher than an average concentration of said oxygen atoms in said bonding layer.

2. The bonded body of claim 1, further comprising an intermediate layer provided between said piezoelectric single crystal substrate and said bonding layer and having a composition of $SiO_2$.

3. The bonded body of claim 1, wherein said piezoelectric single crystal substrate comprises lithium niobate, lithium tantalate, or lithium niobate-lithium tantalate solid solution.

4. An acoustic wave device comprising:
 said bonded body of claim 1; and
 an electrode provided on said piezoelectric single crystal substrate.

* * * * *